United States Patent [19]
Lee

[11] Patent Number: 6,083,782
[45] Date of Patent: Jul. 4, 2000

[54] HIGH PERFORMANCE GAAS FIELD EFFECT TRANSISTOR STRUCTURE

[75] Inventor: Jong Boong Lee, San Jose, Calif.

[73] Assignee: Samsung Electronics Co., Ltd., Seoul, Rep. of Korea

[21] Appl. No.: 09/422,827

[22] Filed: Oct. 21, 1999

Related U.S. Application Data

[62] Division of application No. 08/940,341, Sep. 30, 1997.

[51] Int. Cl.[7] .................. H01L 21/28; H01L 21/3205; H01L 21/44
[52] U.S. Cl. .................. 438/167; 438/267; 438/571; 438/572; 438/172; 438/180; 438/181; 438/176; 438/597; 438/576; 438/604; 438/606
[58] Field of Search .................. 438/267, 167, 438/571, 572, 172, 180, 181, 176, 597, 576, 604, 606

[56] References Cited

U.S. PATENT DOCUMENTS

| | | | |
|---|---|---|---|
| 3,986,196 | 10/1976 | Decker et al. | 357/22 |
| 4,196,439 | 4/1980 | Niehaus et al. | 357/22 |
| 4,499,656 | 2/1985 | Fabian et al. | 29/576 |
| 4,777,516 | 10/1988 | Deschler et al. | 357/17 |
| 4,888,626 | 12/1989 | Davey | 357/22 |
| 4,981,807 | 1/1991 | Jambotkar | 437/31 |
| 5,153,682 | 10/1992 | Goto et al. | 357/29 |
| 5,268,315 | 12/1993 | Prasad et al. | 437/31 |
| 5,369,288 | 11/1994 | Usuki | 257/26 |
| 5,698,875 | 12/1997 | Varmazis | 257/280 |
| 5,742,082 | 4/1998 | Tehrani et al. | 257/280 |
| 5,912,480 | 6/1999 | Zhu et al. | 257/194 |
| 6,008,509 | 12/1999 | Inai et al. | 257/192 |

*Primary Examiner*—Mary Wilczewski
*Assistant Examiner*—James Park
*Attorney, Agent, or Firm*—Townsend and Townsend and Crew LLP

[57] ABSTRACT

An improved GaAs MESFET includes a source contact ohmically coupled to a buffer layer or substrate to stabilize band bending at the interface of the active layer and buffer layer or substrate when an RF signal is applied to a gate electrode.

2 Claims, 3 Drawing Sheets

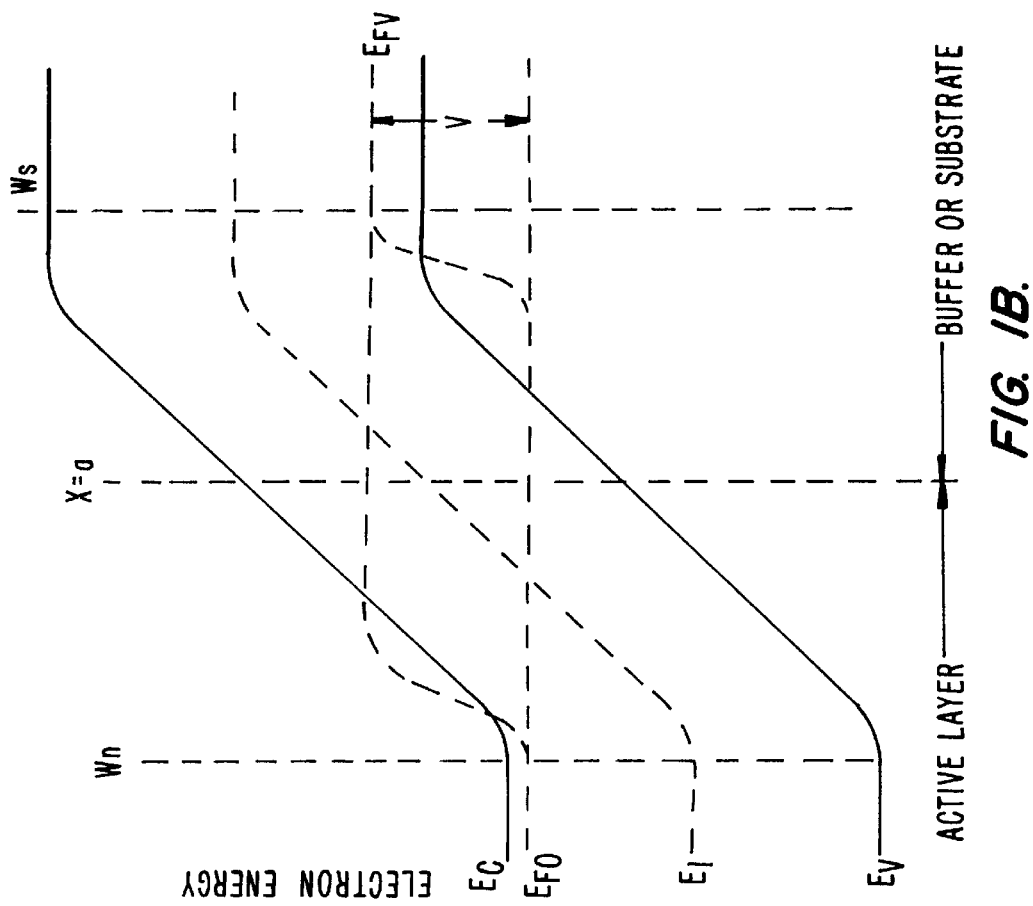
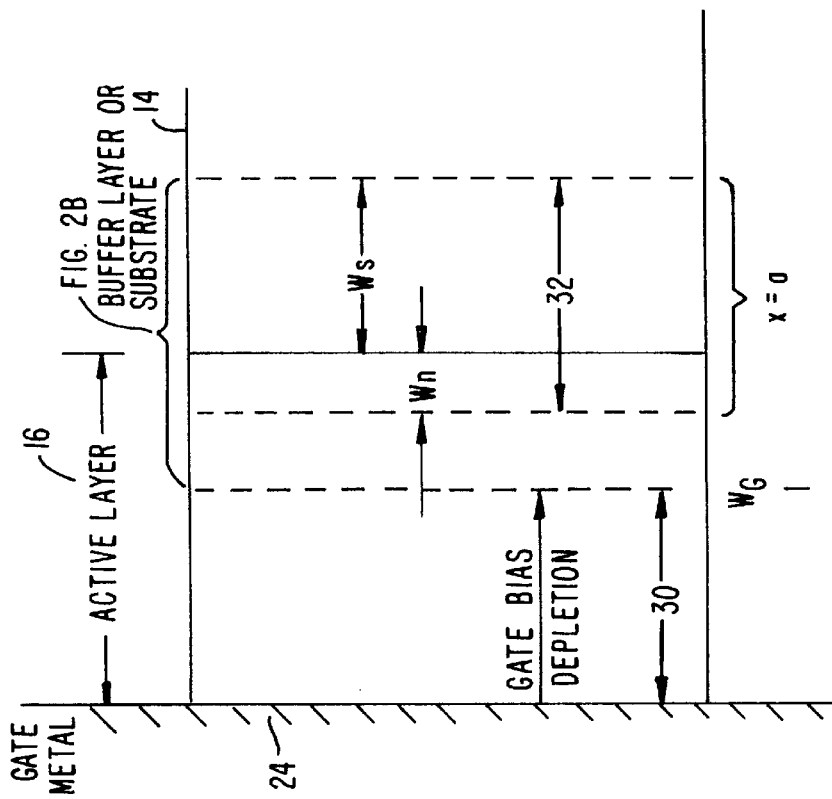
FIG. 1B.
FIG. 1A.

HIGH PERFORMANCE GAAS FIELD EFFECT TRANSISTOR STRUCTURE

CROSS-REFERENCES TO RELATED APPLICATIONS

This application is a divisional of Application No. 08/940,341, filed Sep. 30, 1997, the disclosure of which is incorporated herein by reference

BACKGROUND OF THE INVENTION

Metal Semiconductor Field Effect Transistors (MESFETs) are included in high-frequency circuits utilized in cellular phones, pagers, and other RF devices. A MESFET is formed on the major surface of a semiconductor gallium arsenide (GaAs) substrate having overlying buffer and active layers formed by ion implantation or epitaxial deposition. Ohmic metal contacts are utilized for source and drain contacts and a gate is formed by a Schottky gate metal contact.

FIGS. 1A and 1B depict the vertical structure and band levels of the active layer and buffer layer. Referring to FIG. 1A, the active layer 16 has a top depletion region 30 of width $W_G$ at the interface with the gate metal contact 24 due to the voltage bias on the gate. There is also a bottom depletion layer region 32 at the interface of the active layer 16 and the buffer layer 14. This bottom depletion region 32 extends in the active layer 16 a distance $W_n$ and into the buffer layer 16 a distance $W_s$.

FIG. 1B shows the band bending near the interface between the channel 16 and the buffer layer 14 or substrate 12. When a gate bias is applied on the gate metal contact 24 there is some voltage change on the channel/buffer interface. This voltage difference (the difference between EFV and EFO) quickly becomes zero but normally there is a time transient due to the deep traps at the interface or in other regions and when the buffer in not a perfect ground with the source.

The time transient of the substrate band bending might strongly influence the basic performance of the GaAs MESFET especially RF performance characteristics such as transconductance reduction, anomalies of backgating and hysterisis of the drain current.

Reduction of the band banding at the channel/substrate interface also would improve device linearity, reduce drain current hysterisis, and provide higher gain near the MESFET pinchoff voltage.

Some techniques to reduce band banding have been to select wafers of good material quality, deep implantation of N+ dopant up to the buffer or substrate at the source and drain regions, or implanting a p-type buried layer under the channel.

Each of these techniques has disadvantages such as lowering yield or generating additional deep traps.

SUMMARY OF THE INVENTION

According to one aspect of the invention, an ohmic source contact is coupled to the buffer layer or substrate without any implantation to reduce the transient time of substrate band bending.

According to another aspect of the invention, the source area of a MESFET is deeply-etched to prevent having a substitutional current that results by deep etching the drain also.

According to another aspect of the invention, an improved MESFET is fabricated by providing a substrate having buffer and active layers disposed thereon. The surface is then patterned to expose source regions and chemically etched down to the buffer or substrate region. Ohmic metal evaporation is then utilized to form source and drain contacts with the source contact in ohmic contact with the buffer or substrate.

Other features and advantages of the invention will be apparent in view of the following detailed description and appended drawings.

BRIEF DESCRIPTION OF THE DRAWINGS

FIG. 1A is cross-sectional view of the active and buffer layers of a MESFET;

FIG. 1B is graph depicting band-bending at the active layer/buffer layer interface;

DESCRIPTION OF THE SPECIFIC EMBODIMENTS

Figure 2:
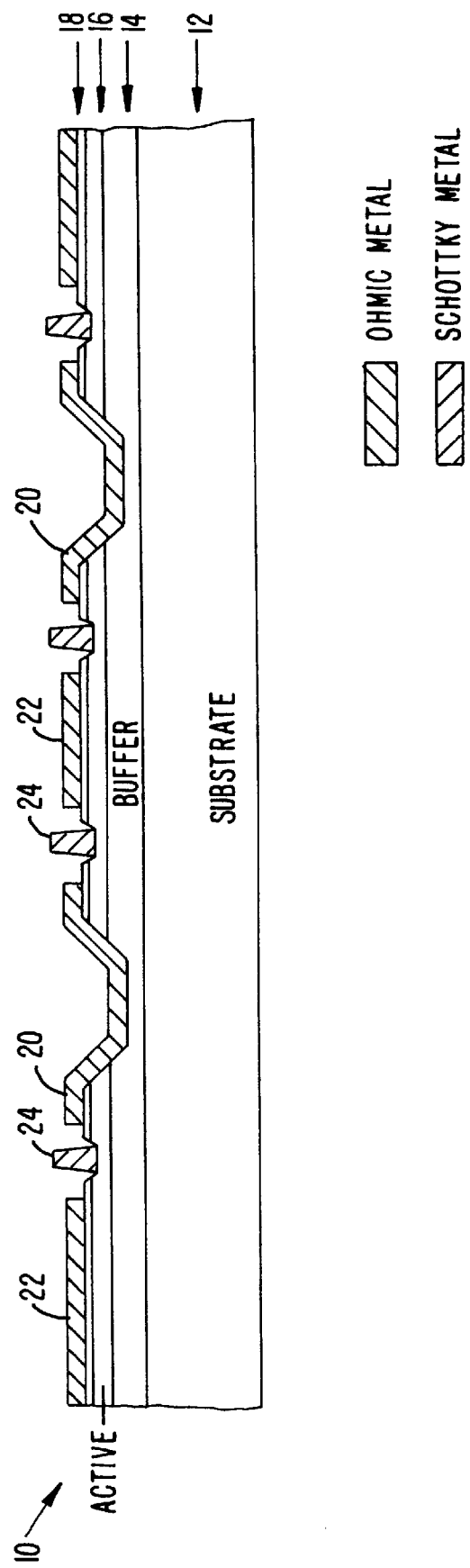
FIG. 2 is a cross-sectional view of an embodiment of the invention.

The preferred embodiments will now be described with reference to the drawings, where like or similar parts are given the same reference numerals throughout the several views. FIG. 2 is a cross-sectional view depicting the vertical structure of a preferred embodiment of the invention.

In FIG. 2, a MESFET 10 GaAs is formed on a substrate 12 having a buffer layer 14, active layer 16, and N cap layer 18 formed thereover. The MESFET includes ohmic metal source and drain contacts 20 and 22 and Schottky metal gate contacts 24. The drain contacts are disposed over the N cap layer 18 while the source contacts are ohmically coupled to the buffer layer 14.

The steps for fabrication the device depicted in FIG. 3 will now be described with reference to FIGS. 3A—3C.

Figure 3A:
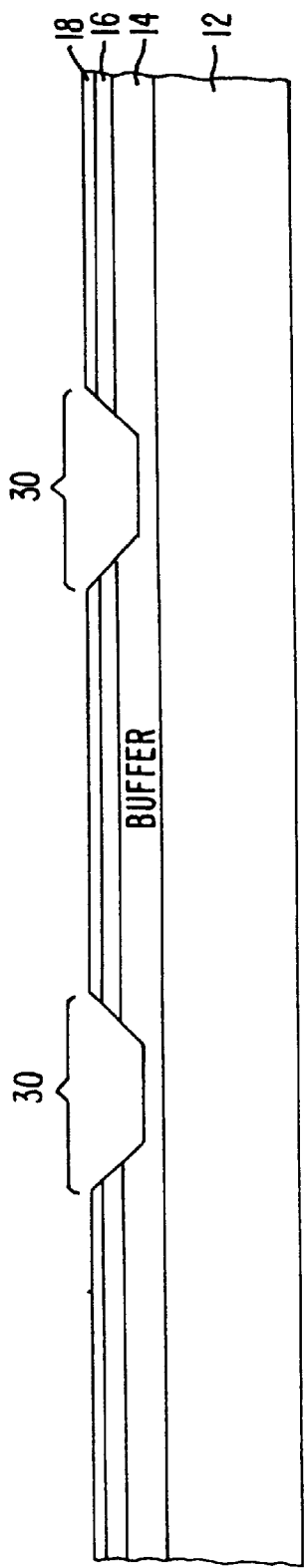
FIGS. 3A—3C are cross-sectional views illustrating process steps for fabricating an embodiment of the invention.

FIG. 3A depicts layered structure having deep etches 30 where the source contacts 20 are to be formed. The fabrication of the layered structure utilizes techniques well-known in the art. For example, the channel may be created by masking the surface and performing a selective channel implant using silicon ions. The silicon serves as an n-type dopant and the implanted area becomes conductive. The cap layer is then deposited utilizing standard techniques. The deep etches are formed by standard chemical etching techniques.

Figure 3B:
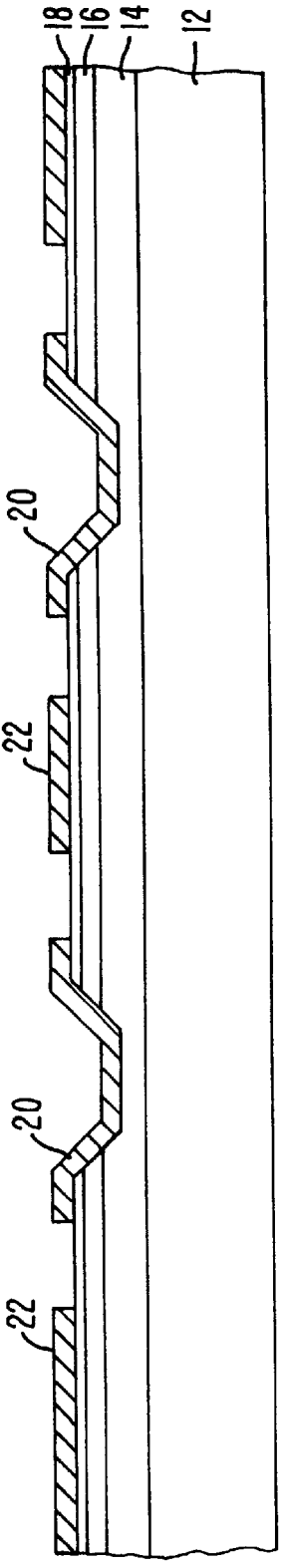

FIG. 3B depicts the device after ohmic source and drain contacts 20 and 22 have been formed. Metallization usually employs gold or gold alloys and is patterned by the lift-off technique.

Figure 3C:
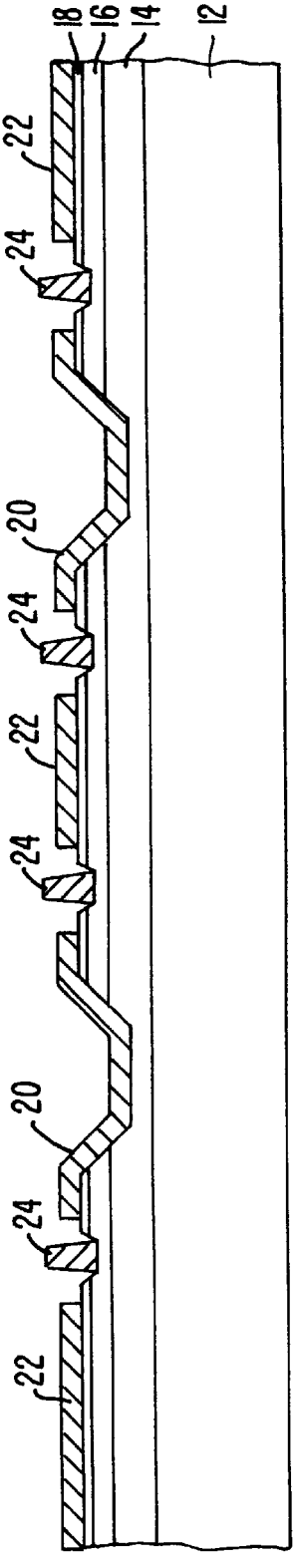

FIG. 3C depicts the device after the formation of the Schottky gate contact 24. The area under the gate is first etched to form a gate recess and then the gate metal is deposited. The gate is produced by a lift-off technique.

As is apparent from FIG. 2, the source contact forms an ohmic connection to the buffer layer. Thus, the electrical potential difference between the source and the buffer layer is zero. This results in stable band bending ever though RF input power is applied on the gate.

The invention can be applied to various devices such as a low noise amplified, power devices and monolithic microwave integrated circuits (MMICs) using implanted and epitaxial wafers in order to improve device performance.

The invention has now been described with reference to the preferred embodiments. Alternatives and substitutions will now be apparent to persons of skill in the art. Accordingly, it is not intended to limit the invention except as provided by the appended claims.

What is claimed is:

1. A method for forming a MESFET having a stable substrate band bending characteristics on a gallium arsenide substrate having a major surface with a buffer layer and an overlying active layer formed thereon, said method comprising the steps of:

chemically etching a source contact opening exposing said buffer layer;

forming a metal source contact ohmically coupled to said buffer layer and to said active layer;

forming a metal drain contact, remote from said source contact, ohmically coupled only to said active layer; and forming a metal gate contact, between said source and drain contact, forming a Schottky contact with said active layer.

2. A method for forming a MESFET having a stable substrate band bending characteristics on a gallium arsenide substrate having a major surface with an active layer formed thereon, said method comprising the steps of:

chemically etching a source contact opening exposing said substrate;

forming a metal source contact ohmically coupled to said active layer and said substrate;

forming a metal drain contact, remote from said source contact, ohmically coupled only to said active layer; and forming a metal gate contact, between said source and drain contact, forming a Schottky contact with said active layer.

* * * * *